(12) United States Patent
Tsuchiya et al.

(10) Patent No.: US 7,570,057 B2
(45) Date of Patent: Aug. 4, 2009

(54) NMR SPECTROMETER

(75) Inventors: Mitsuyoshi Tsuchiya, Hitachi (JP);
Hideo Tsukamoto, Hitachi (JP); Fumio Iida, Hitachi (JP); Toshiyuki Shiino, Hitachi (JP); Hideki Tanaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/014,908

(22) Filed: Jan. 16, 2008

(65) Prior Publication Data
US 2008/0204026 A1 Aug. 28, 2008

(30) Foreign Application Priority Data
Feb. 27, 2007 (JP) .............. 2007-047218

(51) Int. Cl.
*G01V 3/00* (2006.01)

(52) U.S. Cl. ....................... 324/318; 324/322

(58) Field of Classification Search .......... 324/300–322
See application file for complete search history.

(56) References Cited
U.S. PATENT DOCUMENTS 6,570,475 B1 * 5/2003 Lvovsky et al. .......... 335/216
7,046,007 B2 * 5/2006 Okada et al. .............. 324/321
7,141,977 B2 11/2006 Wakuda et al.
2002/0179830 A1 * 12/2002 Pearson et al. ............ 250/250
2008/0204015 A1 * 8/2008 Shiino et al. .............. 324/307

FOREIGN PATENT DOCUMENTS

| JP | 2000-292515 | 10/2000 |
|----|-------------|---------|
| JP | 2002-311118 | 10/2002 |

* cited by examiner

*Primary Examiner*—Brij B Shrivastav
(74) *Attorney, Agent, or Firm*—Antonelli, Terry, Stout & Kraus, LLP.

(57) ABSTRACT

An object of the present invention is to solve the bending of an NMR probe and a room temperature shim coil so that they can be positioned easily. In the NMR spectrometer including split-pair magnets and a cross bore, a high rigidity straight pipe to which an NMR probe and a room temperature shim coil are attached so as to make an integral object, is provided. The outer diameter of the straight pipe is smaller than the inner diameter of a horizontal bore into which the room temperature shim coil and the probe are inserted. After the room temperature shim coil and the NMR probe are attached to the straight pipe by bolts, respectively, the integral object is inserted into the horizontal bore (a room temperature space) of the NMR spectrometer. The room temperature shim coil and the probe may be attached to different straight pipes.

10 Claims, 9 Drawing Sheets

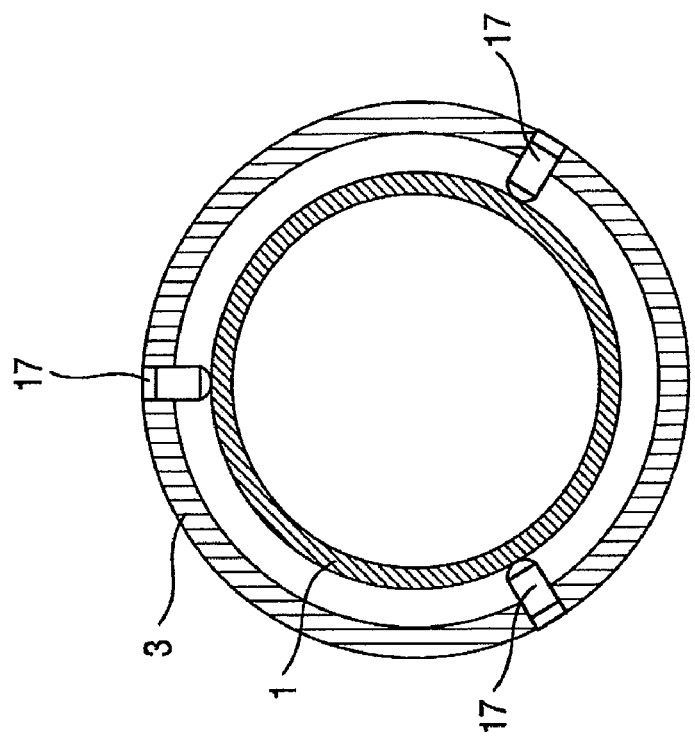
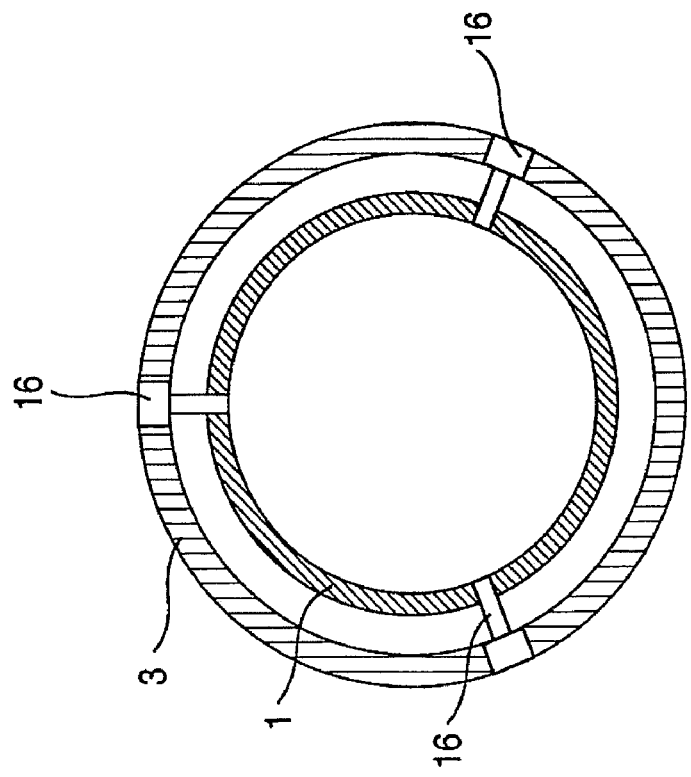

NMR SPECTROMETER

BACKGROUND OF THE INVENTION (1) Field of the Invention

The present invention relates to an NMR spectrometer which has split-pair magnets and a bore having multi axes and, in particular, to positioning of an NMR probe and a room temperature shim coil.

(2) Description of Related Art

In recent years, sensitizing of the NMR spectrometer has been improved so that even for a protein having a complicated molecular structure or the like, structural analysis can be performed by using an NMR signal. As methods for sensitizing of the NMR spectrometer, a method of strengthening the magnetic field strength in a uniform magnetic field space in which a measuring specimen is placed and a method of varying the shape of a probe coil, are known. In the former method, a superconducting wire material is used for a magnet generating the magnetic field, and the sensitization is achieved by improving the properties of the magnet. In the latter method, by changing the shape of the NMR spectrometer from a conventional saddle shape or birdcage shape to a solenoid shape, the detection efficiency of the NMR signal is improved by a shape effect, and improvement of the sensitivity of the NMR spectrometer can be expected.

However, in order to measure the NMR signal using a solenoid probe coil, the axial direction of the probe coil and the direction of the uniform magnetic field space have to be perpendicular to each other. But, this is very difficult to be achieved, because if insertion of a sample tube in the probe coil is also considered, the direction of the uniform magnetic field and the direction in which the sample tube is inserted are coaxial with each other in the NMR spectrometer using the solenoid magnet.

In order to measure the NMR signal in high sensitivity without depending on the configuration of a superconducting magnet and the shape of the probe coil, it is important to accurately install the probe coil and the sample tube in a uniform magnetic field space made by the superconducting magnet and a shim coil for controlling the magnetic field. An NMR spectrometer using a solenoid magnet includes a room temperature space in the vertical direction being substantially equal to the axial direction of the magnet, and has a configuration in which an NMR probe and the sample tube are installed by being inserted from below and above the room temperature space, respectively. Therefore, a method has been considered, in which the sample tube is installed to an accurate position in the axial direction by the shape of a spinner attached to the sample tube and device tools, and the NMR probe is installed to a substantially same position even if it is exchanged or took out and put number of times. Examples with respect to the technology are disclosed in JP-A-2000-292515 and JP-A-2002-311118.

BRIEF SUMMARY OF THE INVENTION

It is also necessary for an NMR spectrometer including split-pair magnets to accurately install the probe coil and the sample tube in a uniform magnetic field space. In general, in the NMR spectrometer including split-pair magnets, a room temperature shim coil is inserted from one end of a horizontal bore and the NMR probe is inserted from the other end of the horizontal bore, and a sample tube is inserted from above a vertical bore. The tips of the room temperature shim coil and the NMR probe are provided with a sample tube inserting hole, respectively.

As illustrated in FIG. 2, by arranging the sample tube inserting hole of a room temperature shim coil, the sample tube inserting hole of the NMR probe, and the sample tube in a state in which they fit to each other in a uniform magnetic field space at the center of a cross bore, the NMR signal is measured. However, the actual NMR probe and room temperature shim coil have extremely elongated cylinder shapes, that is, while the outer diameters of the actual NMR probe and room temperature shim coil are about several dozens of millimeters, the lengths of them are about several dozens of centimeters to several meters, and the diameters of the sample inserting holes are as small as about several millimeters. Therefore, it is not possible to confirm by means of viewing the control of the positions and angles of them at a flange part connected to the NMR spectrometer. As mentioned above, since there are problems that the control of the positions and angles can not be confirmed by means of viewing, that the NMR probe and the room temperature shim coil are bent, and that the NMR probe and the room temperature shim coil themselves are slightly curved, positioning of them are very difficult.

An object of the present invention is to solve the above mentioned problems and to provide an NMR spectrometer provided with split-pair magnets, enabling the NMR probe and the room temperature shim coil to be easily positioned.

According to the present invention, in order to achieve the above mentioned object, the NMR spectrometer including split-pair magnets and a room temperature space having a plurality of directions has a configuration in which the room shim coil and the NMR probe are integrally attached to a high rigidity straight pipe so that the sample tube inserting holes of the straight pipe, the room temperature shim coil and the NMR probe coincide with each other, and the integral object is included inside the room temperature space. After attaching the shim coil and the NMR probe to the straight pipe, the resulting integral object is inserted in the room temperature space. Moreover, the room temperature shim coil and the NMR probe are attached to different straight pipes, respectively. Moreover, the flange portion of the NMR spectrometer includes a positioning mechanism (a tapezoidal rotor) for making the straight pipe to which the room temperature shim coil and the NMR probe are attached, and the room temperature space in which the straight pipe is inserted, substantially coaxial with each other.

In the present invention, since the NMR spectrometer includes a high rigidity straight pipe to which the room temperature shim coil and the NMR probe are attached, respectively, as the positioning mechanism in the room temperature space of the split-pair magnets, the problem of bending of the NMR probe and the room temperature shim coil can be solved. Moreover, before inserting the NMR probe and the room temperature shim coil in the NMR spectrometer, the relative position between them can also be determined by means of viewing.

According to the NMR spectrometer of the present invention, including a high rigidity straight pipe, enables the NMR probe and the room temperature shim coil to be easily positioned in a short time.

Other objects, features and advantages of the invention will become apparent from the following description of the embodiments of the invention taken in conjunction with the accompanying drawings.

BRIEF DESCRIPTION OF THE SEVERAL VIEWS OF THE DRAWING

FIGS. 7A and 7B are partial cross-sectional views illustrating a method for fixing the straight pipe and the NMR probe according to Example 4;

DETAILED DESCRIPTION OF THE INVENTION

Hereinafter, a plurality of Examples of the present invention will be described with reference to drawings.

EXAMPLE 1

Figure 2:
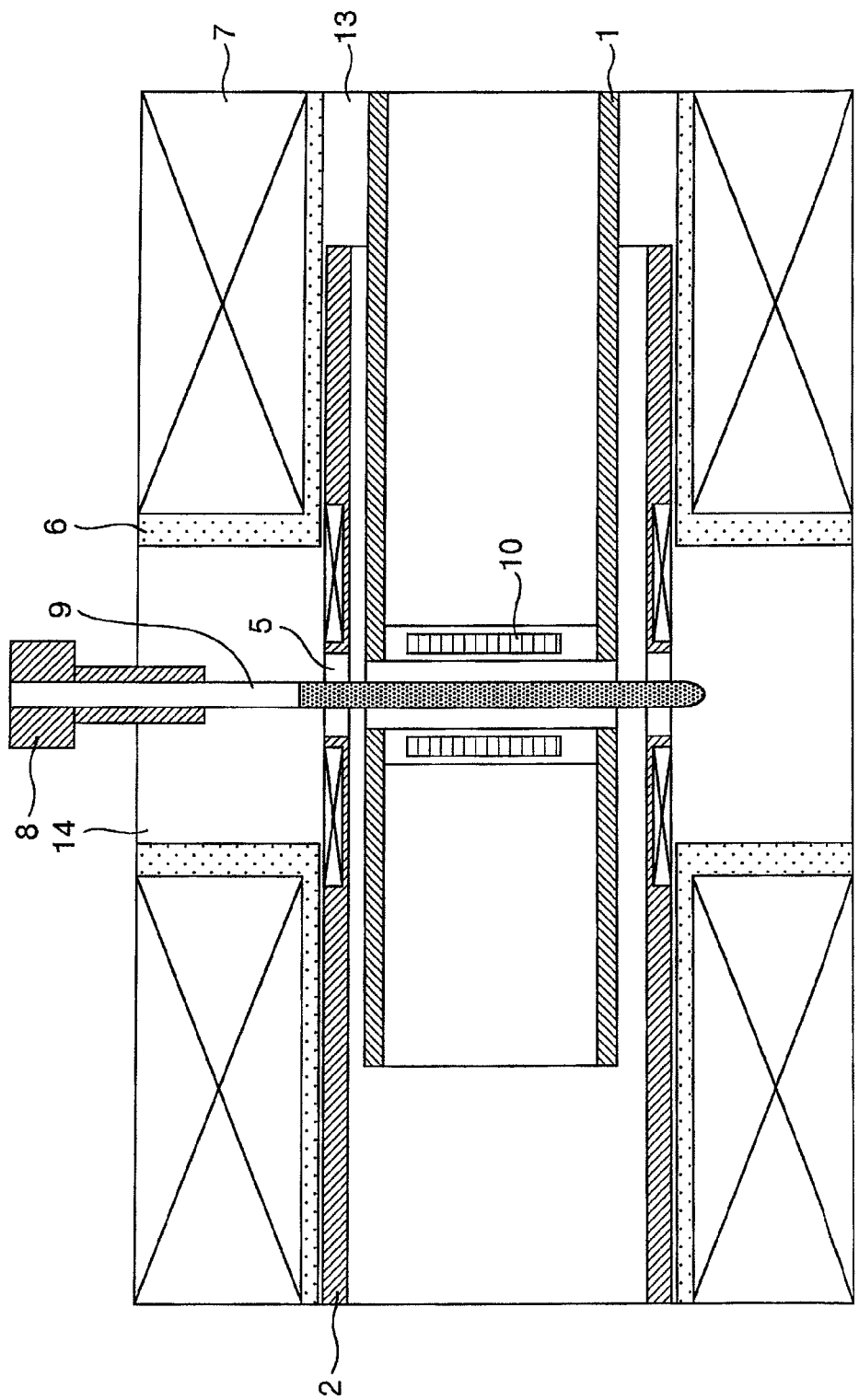
FIG. 2 is a partial configuration diagram illustrating the configuration of a usual NMR spectrometer including a split-type magnet.

FIG. 2 is a partial configuration diagram of a general NMR spectrometer including split-pair magnets. As the split-pair magnets 7 generating a static magnetic field, is used a superconducting magnet having a configuration in which a horizontal bore 13 (a room temperature space in a horizontal direction) and a vertical bore 14 (a room temperature space in a vertical direction) are included, and the outside of the magnets are cooled by a cryostat 6. Inside the horizontal bore 13 an NMR probe 1 and a room temperature shim coil 2 are arranged, and a sample tube 9 is inserted in sample tube inserting holes 5 from the vertical bore 14. The sample tube inserting holes 5 of both of the NMR probe 1 and the room temperature shim coil 2 are coincided with each other by positioning. Around the sample tube inserting hole 5 of the NMR probe 1, a probe coil 10 for detecting an NMR signal from the sample of the sample tube 9 is provided.

In order to measure the NMR signal in high sensitivity, it is necessary to install the probe coil 10 and the sample tube 9 in sufficient accuracy, in a uniform magnetic field space generated by the superconducting magnet 7 and the shim coil 2 controlling the magnetic field. The NMR probe 1 has to include circuits for transmitting/receiving a signal to and from a coil 10 provided at the tip, and a mechanism for controlling the circuits inside the probe from the circuit portion to the back end portion of the probe. Therefore, it is desirable for the inner diameter of the probe to be as large as possible. On the contrary, since the NMR probe 1 is set inside the room temperature shim coil 2, as the outer diameter of the NMR probe 1 becomes larger, the diameter of the room temperature shim coil 2 also becomes larger, so the magnetic field correction capability of the room temperature shim coil 2 decreases. Accordingly, it is desirable for the outer diameter of the NMR probe 1 to be small. From these, it is desirable for the thickness of the NMR probe to be thin. However, since while the outer diameter of the NMR probe 1 is about several dozens of millimeters, the length of the NMR probe 1 is several dozens of centimeters to several meters, and in particular, at the tip, a ferromagnetic material (for example, iron) can not be used from a view point of improvement of uniformity of the magnetic field strongly affecting the measurement sensitivity, the rigidity of the NMR probe lowers, resulting in bending.

Figure 1:
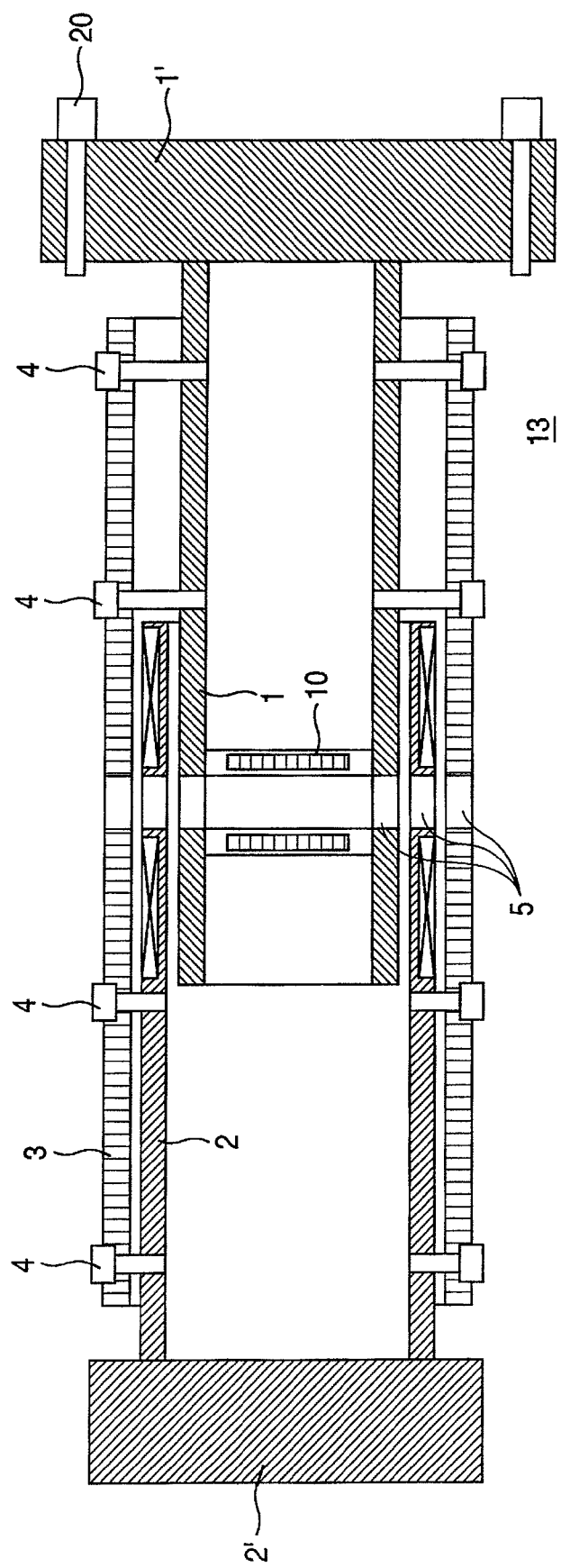
FIG. 1 is a partial configuration diagram illustrating the positioning of the probe, the room temperature shim coil, and the straight pipe inside the horizontal bore in a partial configuration of the NMR spectrometer according to Example 1.

FIG. 1 is a partial configuration diagram illustrating the structure inside a horizontal bore in a partial configuration of the NMR spectrometer according to Example 1. An NMR probe 1 and a shim coil 2 are attached to a straight pipe 3 made of steel with bolts 4. The straight pipe 3 is made of a high rigidity material, for example, such as SUS, having elastic modulus of about 200 GPa or more, and the thickness thereof is about several millimeters. This enables the rigidity of the NMR probe 1 to be enhanced equivalently, enabling the problem of bending of the probe to be reduced. Moreover, in order to enhance the efficiency of magnetic filed correction capability, the diameter of the room temperature shim coil 2 is made small. In particular, since the tip of the coil has problems of an eddy current and heat generation when the coil is energized, it is desirable for a coil bobbin to use a ceramic material having low electric conductivity and good thermal conductivity, resulting in bending of the coil bobbin due to the low rigidity of the material. In the present Example, fixing also the room temperature shim coil 2 using the straight pipe 3 made of a high rigidity material, such as SUS, and the bolts 4, enables the problem of bending to be reduced.

Although, in FIG. 1, for fixing the NMR probe 1 and the room temperature shim coil 2 to the straight pipe 3, bolts 4 are used, any structure that fixes them to the straight pipe, such as a structure of screw stopping, may be used. Moreover, although as the example of the material of the straight pipe 3, a material having high elastic modulus, such as SUS, is used, if having high rigidity, a material having lower elastic modulus than that of SUS, such as Cu, Al and brass, may be used. In these cases, a straight pipe 3 having a thickness of, for example, about 10 mm or more, may be used, which is sufficiently thicker than those of the NMR probe 1 and the room temperature shim coil 2 being about several millimeters.

When assembling the structure illustrated in FIG. 1, first, the room temperature shim coil 2 is inserted inside the straight pipe 3 and they are fixed to each other, and next, the NMR probe 1 is inserted inside the room temperature shim coil 2, and the straight pipe 3 and the NMR probe 1 are fixed to each other. Since the assembling operation can be performed before the insertion into the NMR spectrometer, when the room temperature shim coil 2 and the NMR probe 1 are fixed, the positions and angles of the sample tube inserting holes of them and the sample tube inserting hole of the straight pipe 3 can be coincided with each other by means of viewing or using a gage or the like.

Figure 3:
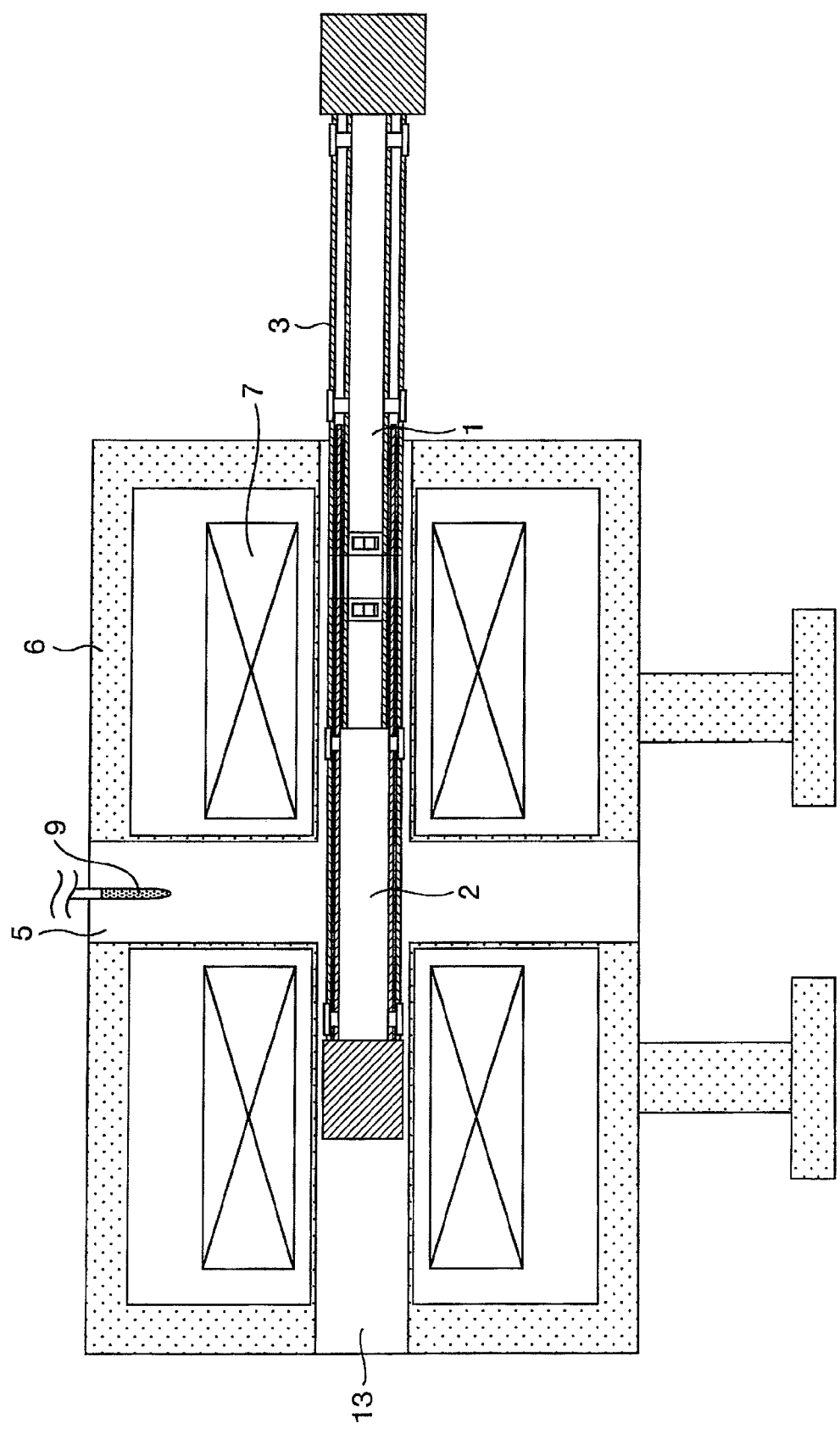
FIG. 3 is an assembly view illustrating a method for inserting an integral object of the probe, the room temperature shim coil, and the straight pipe into the cryostat in the NMR spectrometer according to Example 1.
Figure 4:
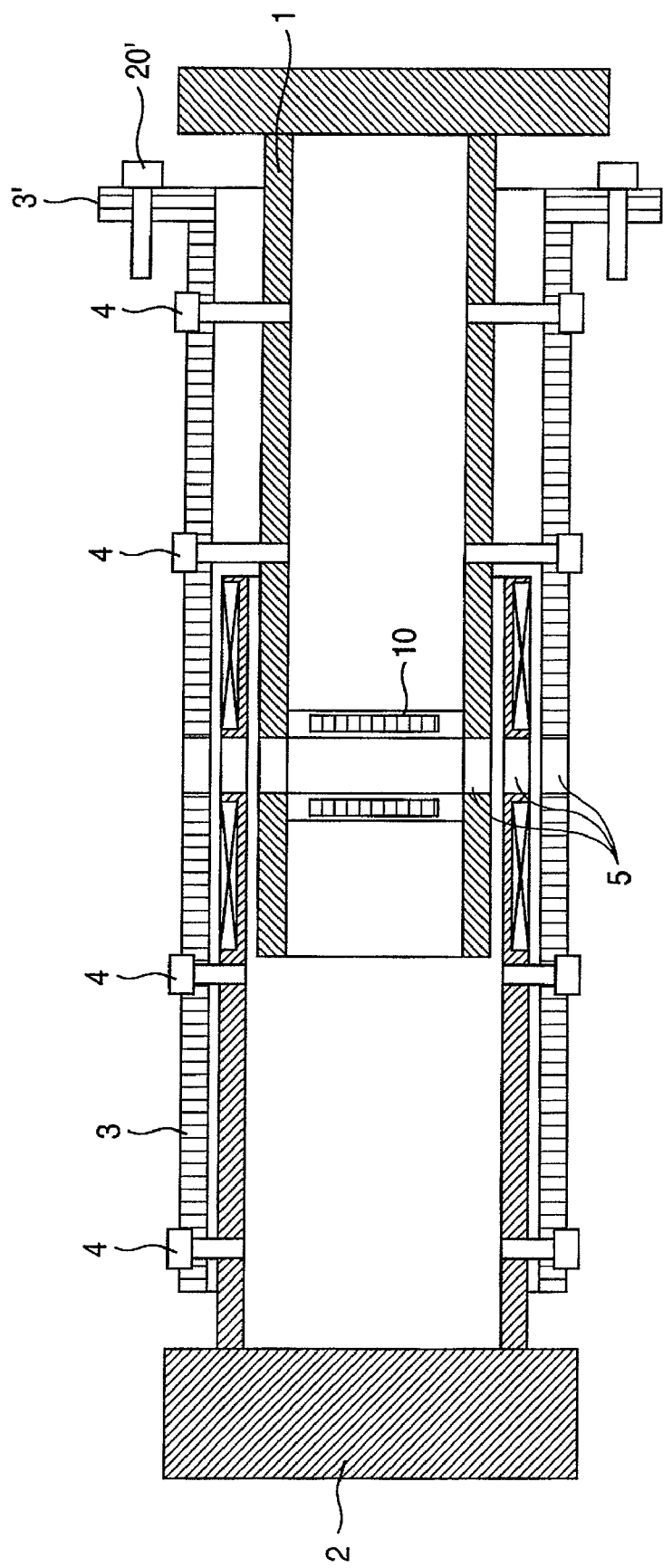
FIG. 4 is a partial configuration diagram illustrating a configuration that is a modified example of NMR spectrometer according to Example 1, in which the straight pipe is provided with a connection flange between the straight pipe and the cryostat.

After that, as illustrated in FIG. 3, the assembled integral body is inserted into the horizontal bore 13 from one direction of the bore, and fixed to a cryostat 6 at a flange 1' of the NMR probe 1 by bolts 20. This enables the axial deviation between the sample tube inserting holes 5 of the NMR probe 1 and the room temperature shim coil 2 to be suppressed within about 0.1 mm, making the alignment of the sample tube inserting holes and the sample tube very easy. It is desirable that the room temperature shim coil side (the side to be inserted in the horizontal bore) has a structure for fixing the integral body with respect to the horizontal bore 13 by set-screws. However, it is sufficient for these methods of fixing to be a method in which the integral body of the NMR probe 1, the room temperature shim coil 2, and the straight pipe 3 is fixed to the cryostat 6. For example, as illustrated by modified example in FIG. 4, rather than the flange 1' of the NMR probe 1, a flange 3' provided to the straight pipe 3 may be fixed to the cryostat 6 by bolts 20'. Moreover, the room temperature shim coil side may have a structure in which a flange is attached to the room temperature shim coil 2 or the straight pipe 3, and the flange and the cryostat 6 are fixed to each other by bolts, instead of the set-screws.

EXAMPLE 2

Figure 5:
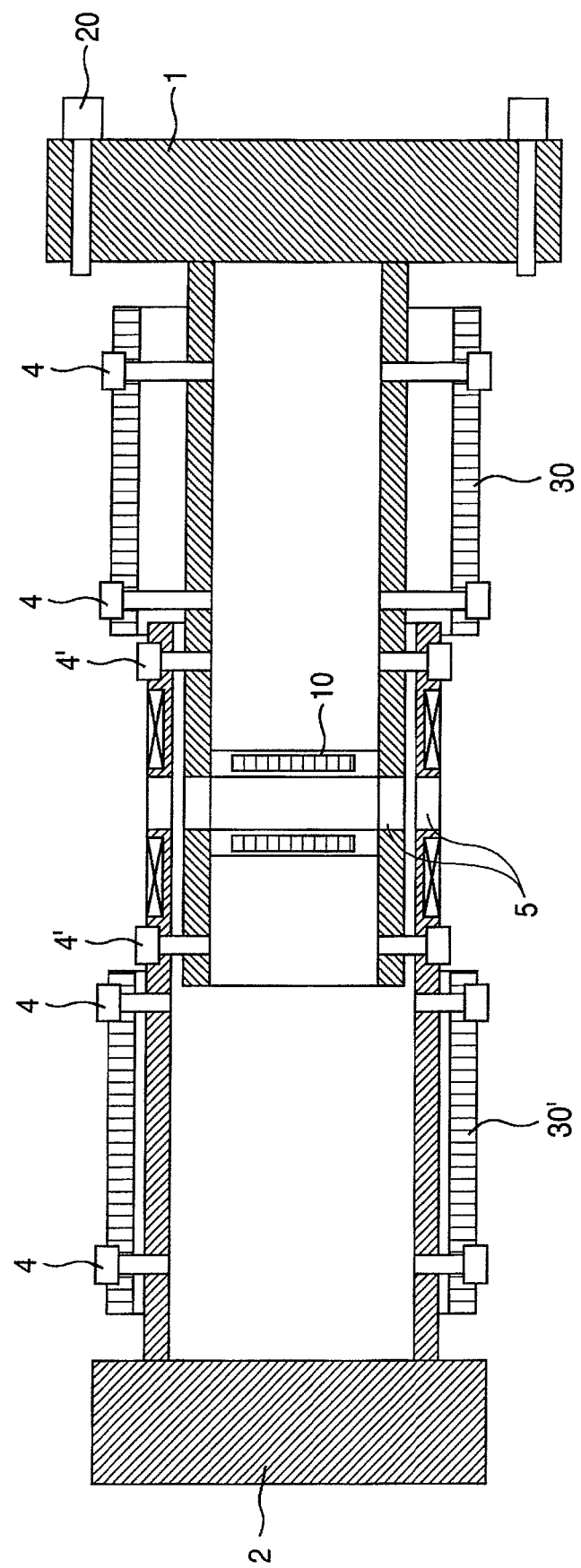
FIG. 5 is a partial configuration diagram in which the NMR probe and the room temperature shim coil are provided with different straight pipes in a partial configuration of the NMR spectrometer according to Example 2.

FIG. 5 is a partial configuration diagram illustrating the structure inside a horizontal bore according to Example 2. While in Example 1, the NMR probe 1 and the room temperature shim coil 2 are fixed to the same straight pipe 3, in Example 2, a configuration is used, in which they are fixed to different straight pipes 30 and 30', respectively. Since in Example 2, a supporting structure is used, in which the NMR probe 1 and the room temperature shim coil 2 are fixed at one side thereof from different ends, respectively, the rigidity of the structure becomes lower than that of in Example 1, in which they are supported at both ends thereof. However, since while in FIG. 1, the objects to be axially aligned regarding the sample tube inserting holes 5 are the NMR probe 1, the room temperature shim coil 2, and the straight pipe 3, in this case the objects are the NMR probe 1 and the room temperature shim coil 2, axial alignment of the sample tube inserting holes 5 can be performed more easily.

As mentioned above, when the NMR probe 1 and the room temperature shim coil 2 are fixed to the different straight pipes 30 and 30', respectively, there is no problem for fixing the NMR probe 1 and the room temperature shim coil 2 to the straight pipes 30 and 30', respectively, only by bolts 4. However, in order to enhance the rigidity of the integral body, the respective tips of the NMR probe 1 and the room temperature shim coil 2 may be fixed further by bolts 4'.

EXAMPLE 3

Figure 6:
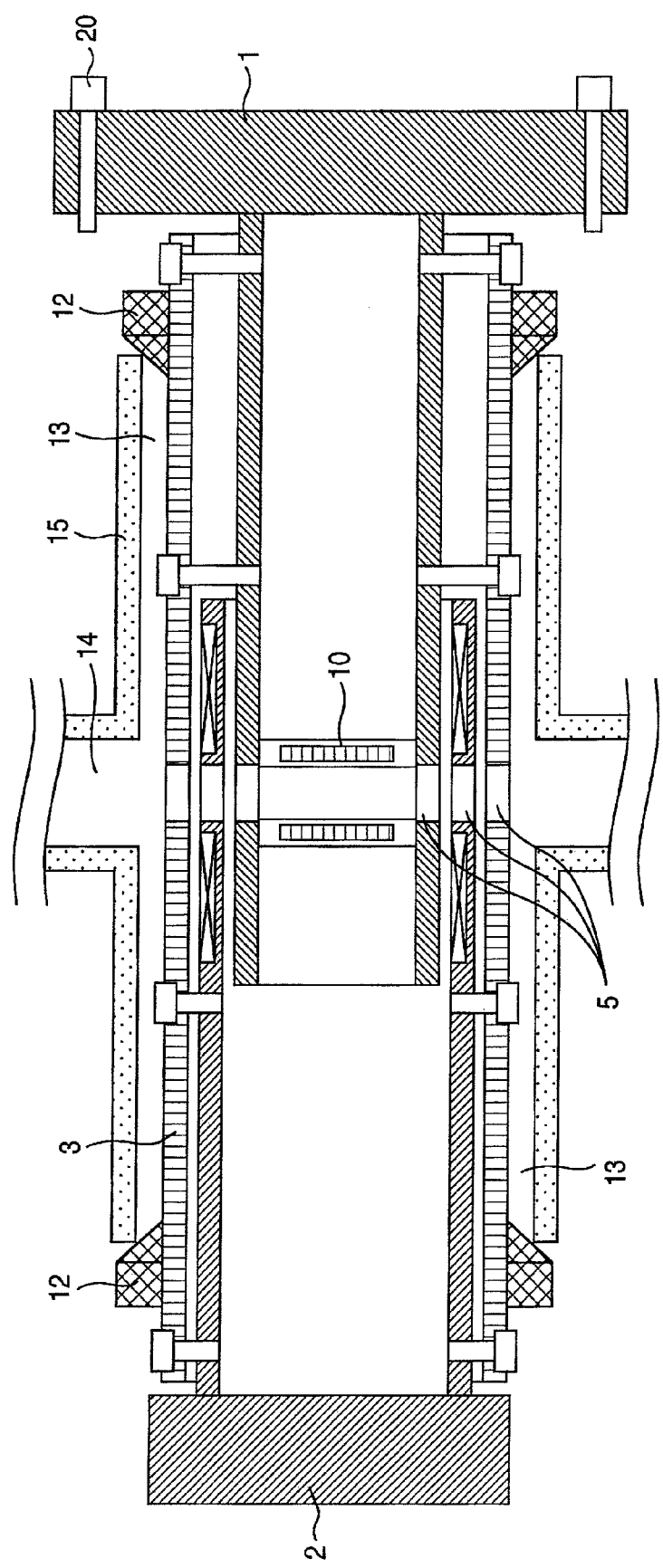
FIG. 6 is a partial configuration diagram in which the positioning mechanism illustrated in FIG. 1 is added with a structure for making an object coaxial with the room temperature space in a partial configuration of the NMR spectrometer according to Example 3.

FIG. 6 is a partial configuration diagram showing the structure inside the horizontal bore according to Example 3. In FIG. 6, in addition to the positioning mechanism illustrated in FIG. 1, such a positioning mechanism (a tapezoidal rotor) 12 that makes the axis of the integral body of the NMR probe 1, the room temperature shim coil 2 and the straight pipe 3, and the axis of the horizontal bore 13 coaxial with each other, is also included.

For example, as in FIG. 3, when a integral body is inserted in the horizontal bore 13 formed by the cryostat 6 from the side of the room temperature shim coil 2, as in FIG. 6, the tapezoidal rotor 12 is attached to one end (the side of the NMR probe 1) of the straight pipe 3, and the integral body of the NMR probe 1, the room temperature shim coil 2 and the straight pipe 3 is inserted therein. After the integral body is inserted therein, another tapezoidal rotor 12 is attached to the other end (the side of the room temperature shim coil 2) of the straight pipe from the side of the room temperature shim coil 2. Providing the tapezoidal rotors 12 to the both ends of the straight pipe and further fixing the tapezoidal rotors 12 at positions contacting with the inner wall of the room temperature space (a horizontal bore) 13 in this manner, enables the integral body to be installed passively and substantially coaxially with respect to the room temperature space 13. This enables deviation in the horizontal direction and the vertical direction with respect to the probe inserting direction between the axis of a room temperature space (a vertical bore) 14 in which a sample tube 9 is inserted and the axis of the sample tube inserting holes 5 of the integral body, to be substantially eliminated.

In addition, the reason why the tapezoidal rotor 12 is used as the positioning mechanism in FIG. 6 is the necessity of a structure contacting with the inner wall of the room temperature space 13, thereby, a structure with any shape other than the tapezoidal rotor may be used, if it is equivalent to the structure contacting with the inner wall of the room temperature space 13.

EXAMPLE 4

FIGS. 7A and 7B are cross-sectional views illustrating methods for fixing the NMR probe and the straight pipe. FIG. 7A shows a method for fixing them by pull bolts 16 at a position close to a sample-measuring space, and FIG. 7B shows a method for fixing them by push bolts 17 at a position distant from the sample-measuring space. Combination of such fixing methods, when a temperature change occurs in the NMR probe 1 by heat generation due to energizing the room temperature shim coil and a gradient magnetic field coil, enables the extraction and contraction in axial direction generated by the temperature change to escape to a position distant from the sample-measuring space. This causes the axial deviation of the position of the sample tube inserting holes to occur hardly.

Although, FIG. 7A illustrates a fixing method only by the pull bolts 16, since it is enough for the NMR probe and the straight pipe to be fixed in radial and axial directions, for example, a method for fixing them by a combination of the push bolts and the pull bolts may be used. Moreover, although the method for fixing the NMR probe 1 and the straight pipe 3 is illustrated here, a similar method can be used for fixing the room temperature shim coil 2 and the straight pipe 3. Moreover, although, in FIGS. 7A and 7B, they are fixed at three points, respectively, a method for fixing them at points equal to or greater than three, may also be used.

EXAMPLE 5

In a conventional split type NMR spectrometer, by providing a fitting mechanism to an NMR probe 1 with respect to a sample rotating mechanism 21 and a sample temperature controlling mechanism 22, an sample is placed in an sample tube inserting hole 5 provided to the probe, and the sample temperature has been controlled. However, since the fitting part degrades the axial symmetry viewed from a direction in which a magnetic field is applied, the fitting part has caused the uniformity of the magnetic field to be reduced. Thereby, since, by providing the fitting mechanism to a straight pipe not to the probe, a part disturbing the magnetic field uniformity becomes distant from the sample measuring space, the magnetic field uniformity improves, leading to a high sensitivity.

Figure 8:
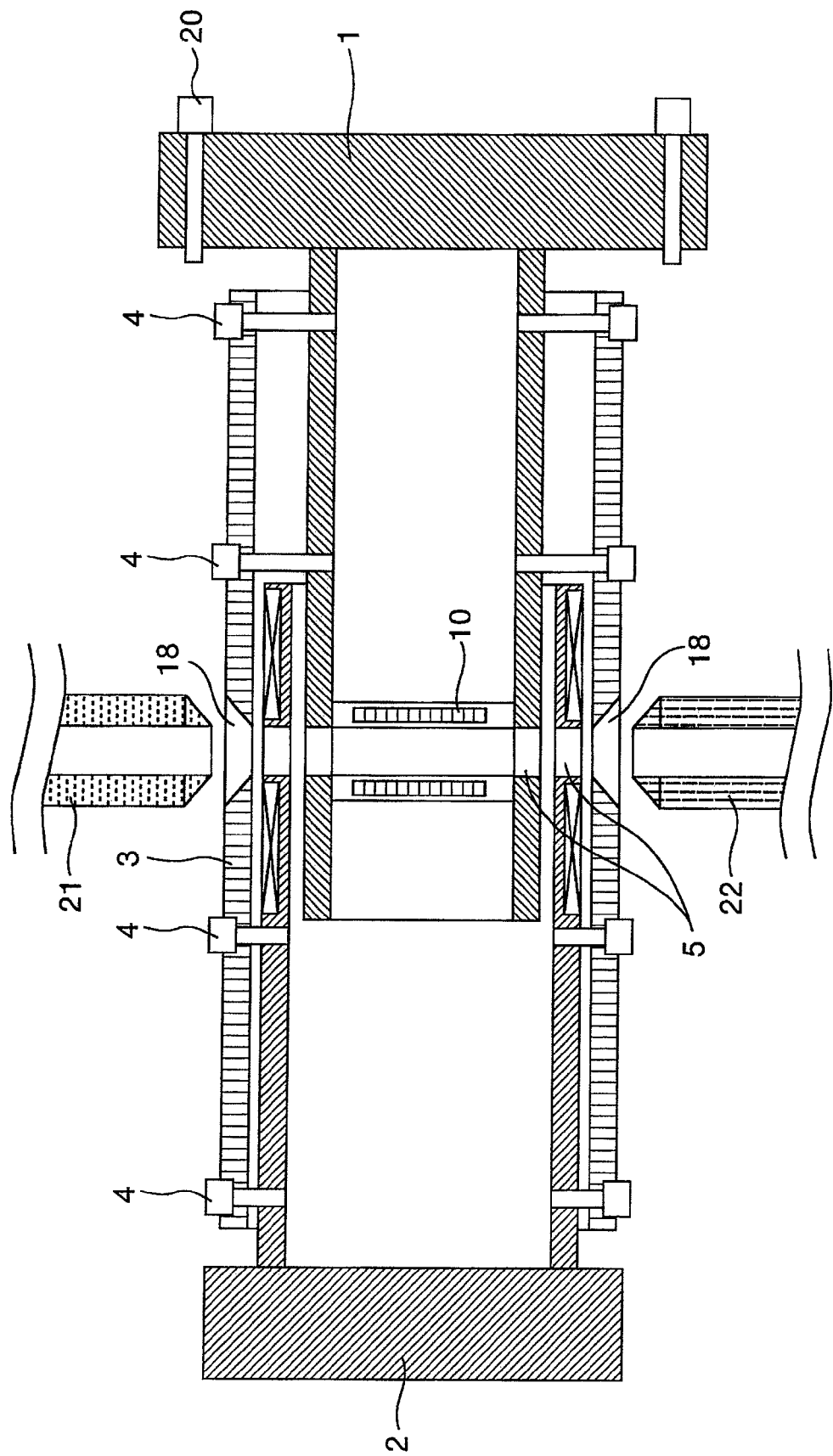
FIG. 8 is a partial configuration diagram illustrating a structure in which the NMR spectrometer includes a fitting mechanism with respect to a sample rotating mechanism and a sample temperature controlling mechanism in a partial configuration of the NMR spectrometer according to Example 5.

FIG. 8 is a partial configuration diagram according to Example 5, and illustrates the positioning mechanism illustrated in FIG. 1, in which the straight pipe 3 is provided with a taper 18 as a fitting mechanism with respect to the tip 21 of the sample rotating mechanism and the tip 22 of the sample temperature controlling mechanism. In a split type NMR spectrometer, through the taper 18, the tip 21 of the sample rotating mechanism for charging and discharging and rotating a sample is inserted from a room temperature space (a vertical bore) 14 above in the vertical direction, and the tip 22 of the sample temperature controlling mechanism for controlling the sample temperature to be a constant temperature is inserted from a room temperature space (a vertical bore) 14 below in the vertical direction. This enables the rotation of the sample and the control of the sample temperature required for high sensitivity and high resolution NMR measurement.

EXAMPLE 6

Figure 9:
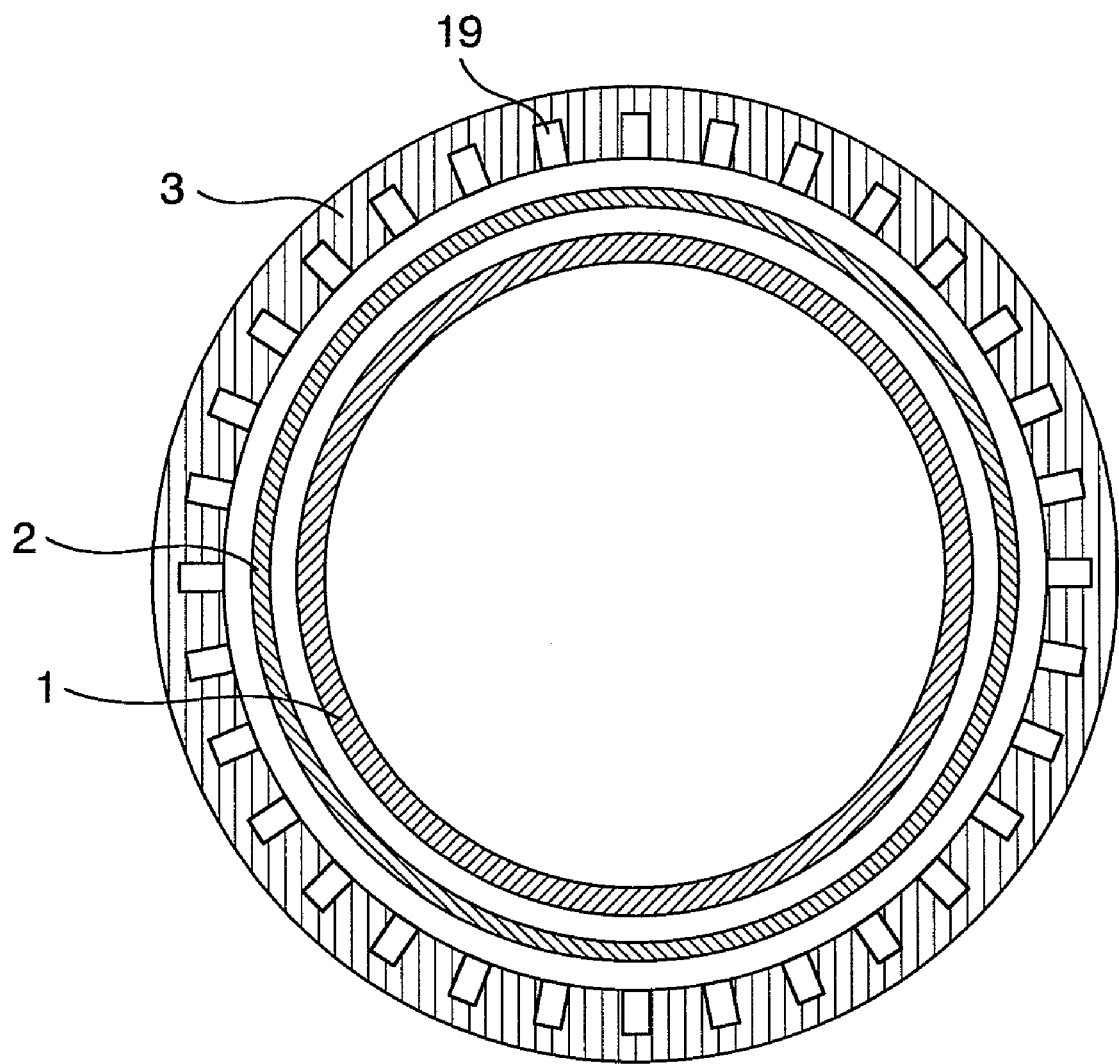
FIG. 9 is a partial cross-sectional view of the straight pipe according to Example 6.

FIG. 9 is a partial cross-sectional view of the structure inside the straight pipe, in a partial configuration of the NMR spectrometer according to Example 6. The inner wall of the straight pipe 3 of the positioning mechanism illustrated in FIG. 1 is provided with grooves 19 in a direction substantially the same as the direction in which the magnetic field is applied. Since the rigidity of the straight pipe is high, it is preferable for the material of the straight pipe to be a metal. At that time, providing the straight pipe 3 with grooves 19, enables to reduce the influence resulting from the eddy current occurring when a gradient magnetic field is applied to the straight pipe by a gradient magnetic field coil provided to the probe 1. Since the eddy current flows on the surface of the metal, a depth of 1 mm is sufficient for the depth of the grooves, however, it is difficult to provide grooves only in the inner wall, thereby, from a view point of workability of the grooves, the straight pipes may be provided with holes instead of the grooves. Further, although, in FIG. 9, a straight pipe provided with grooves only in the axial direction thereof is illustrated, the straight pipe may be provided with such grooves that cut off the eddy current flowing in the peripheral direction. In other words, the direction of the grooves may be any direction if it is not perpendicular to the direction in which the magnetic field is applied, and further the grooves may be provided to the straight pipe in a plurality of directions.

As mentioned above, the present invention is intended to easily perform positioning of the NMR probe and the room temperature shim coil for the split type NMR spectrometer. In addition, the spirit of the present invention can be applied not only to the NMR spectrometer but also to all devices requiring fitting of objects each having a length being equal to or greater than several dozens of centimeters in an accuracy of 0.1 mm order.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An NMR spectrometer including split-pair magnets and a room temperature space with a plurality of directions, wherein a room temperature shim coil and an NMR probe are integrally attached to a high rigidity straight pipe to form an integral object so that sample tube inserting holes of the straight pipe, the room temperature shim coil and the NMR probe coincide with each other, and the integral object is provided inside the room temperature space.

2. The NMR spectrometer according to claim 1, wherein after the room temperature shim coil and the NMR probe are attached to the straight pipe, the integral object is inserted into the room temperature space.

3. The NMR spectrometer according to claim 1, wherein the straight pipe is provided to the room temperature shim coil and the NMR probe, separately.

4. The NMR spectrometer according to claim 1, wherein, the NMR probe and the straight pipe are fixed to each other at a position close to the sample tube inserting holes, and further at a position distant from the sample tube inserting holes.

5. The NMR spectrometer according to claim 1, wherein, the room temperature shim coil and the straight pipe are fixed to each other at a position close to the sample tube inserting holes, and further at a position distant from the sample tube inserting holes.

6. The NMR spectrometer according to claim 1, wherein positioning mechanisms are provided between outer walls of the room temperature space and both end sides of the straight pipe so that the positions thereof can be controlled, and the straight pipe and the room temperature space to be inserted with the straight pipe are coaxial with each other.

7. The NMR spectrometer according to claim 1, wherein, a fitting mechanism for installing a sample tube is provided above one of the sample tube inserting holes of the straight pipe.

8. The NMR spectrometer according to claim 1 wherein, a fitting mechanism for installing temperature controlling means controlling sample temperature in the sample tube to be constant is provided below one of the sample tube inserting holes of the straight pipe.

9. The NMR spectrometer according to claim 1, wherein, an inner wall of the straight pipe is provided with grooves or through holes penetrating from the inner wall to an outer wall of the straight pipe.

10. The NMR spectrometer according to claim 1, wherein a direction in which the NMR probe is inserted in the room temperature space is perpendicular to a direction in which a sample tube is inserted in the sample tube inserting holes.

\* \* \* \* \*